(12) United States Patent
Warnes et al.

(10) Patent No.: US 8,539,145 B1
(45) Date of Patent: Sep. 17, 2013

(54) INCREASING THE NUMBER OF RANKS PER CHANNEL

(75) Inventors: Lidia Warnes, Roseville, CA (US);
Dennis Carr, Roseville, CA (US);
Michael B. Calhoun, Roseville, CA (US); Aaron R. Mandle, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 694 days.

(21) Appl. No.: 12/510,822

(22) Filed: Jul. 28, 2009

(51) Int. Cl.
*G06F 13/00* (2006.01)

(52) U.S. Cl.
USPC ............ 711/105; 365/189.05; 365/230.06; 711/115

(58) Field of Classification Search
None
See application file for complete search history.

(56) References Cited

U.S. PATENT DOCUMENTS

| | | | |
|---|---|---|---|
| 6,209,074 B1 * | 3/2001 | Dell et al. | 711/170 |
| 7,259,585 B2 * | 8/2007 | Brinkman et al. | 326/30 |
| 7,289,383 B2 | 10/2007 | Cornelius | |
| 7,289,386 B2 * | 10/2007 | Bhakta et al. | 365/230.06 |
| 7,609,567 B2 * | 10/2009 | Rajan et al. | 365/189.2 |
| 2006/0117152 A1 * | 6/2006 | Amidi et al. | 711/154 |
| 2006/0277355 A1 * | 12/2006 | Ellsberry et al. | 711/5 |
| 2009/0031078 A1 | 1/2009 | Warnes et al. | |

FOREIGN PATENT DOCUMENTS

JP  10320270 A  * 12/1998

OTHER PUBLICATIONS

English translation of JP10320270 retrieved from STIC. 11 pages.*
Anonymous, "Using Two Chip Selects to Enable Quad Rank," Dec. 2005. ip.com. retrievable at http://www.ip.com/pubview/IPCOM000132468D.*
JEDEC Standard No. 21-C Annex J: Serial Presence Detects for DDR2 SDRAM (Revision 1.3). Jan. 2007. 60 pages.*

* cited by examiner

*Primary Examiner* — Alexander Sofocleous

(57) ABSTRACT

A computer-implemented method for increasing a number of ranks per channel. The channel comprises at least one buffered dual in-line memory module (DIMM). The at least one buffered DIMM comprises a conventional number of ranks and a conventional number of pins. The method includes receiving a memory access request at a memory controller, wherein the memory controller comprises a conventional number of pins. The method also includes encoding a plurality of chip-select (CS) signals at the memory controller, wherein the plurality of CS signals are based on the memory access request, such that the number of ranks per channel increases compared to a conventional number of ranks per channel while not requiring an increase in the number of pins in the memory controller compared to the conventional number of pins of the memory controller.

17 Claims, 6 Drawing Sheets

300

Receive a memory access request at a memory controller where the memory controller comprises a conventional number of pins
310

Encode a plurality of chip-select (CS) signals at the memory controller where the plurality of CS signals are based on the memory access request. The number of ranks per channel increases compared to a conventional number of ranks per the channel while not requiring an increase in the number of pins in the memory controller compared to the conventional number of pins of the memory controller
320

Encode a reduced plurality of CS signals at the memory controller, where the reduced plurality of CS signals is less than a conventional plurality of CS signals
325

Encoding a single on-die-termination (ODT) signal and a single clock-enable (CKE) signal at the memory controller for the increase in the number of ranks per channel.
330

| Receive a plurality of encoded chip-select (CS) signals at a buffer of the at least one buffered DIMM |
| --- |
| 410 |

↓

| Decode the plurality of CS signals at the buffer of the at least one buffered DIMM. The number of ranks per the channel increases compared to a conventional number of ranks per the channel while not requiring an increase in the number of pins in the at least one buffered DIMM compared to the conventional number of pins of the at least one buffered DIMM. |
| --- |
| 420 |

↓

| Decode a single on-die-termination (ODT) signal at the buffer of the at least one buffered DIMM for the increase in the number of ranks per channel |
| --- |
| 430 |

↓

| Decode a single clock-enable (CKE) signal at the buffer of the at least one buffered DIMM for the increase in the number of ranks per channel. |
| --- |
| 440 |

↓

| Determine if said plurality of CS signals belong to the at least one buffered DIMM by DIMM Inter-Integrated Circuit ($I^2C$) addressing. |
| --- |
| 450 |

↓

| Increase the number of ranks per channel to at least 32 ranks per channel |
| --- |
| 460 |

↓

| Reduce a number of on-die-termination (ODT) pins needed at the at least one buffered DIMM compared to a conventional number of ODT pins needed at the at least one said buffered DIMM based at least, in part, by DIMM Inter-Integrated Circuit ($I^2C$) addressing |
| --- |
| 470 |

↓

| Reduce a number of clock-enable (CKE) pins needed at the at least one buffered DIMM compared to a conventional number of CKE pins needed at the at least one buffered DIMM based at least, in part, by DIMM Inter-Integrated Circuit ($I^2C$) addressing. |
| --- |
| 480 |

Receive a memory access request at a memory controller where the memory controller comprises a conventional number of pins
510

Encode a plurality of chip-select (CS) signals at the memory controller where the plurality of CS signals are based on the memory access request.
520

Decode the plurality of CS signals at a buffer of the buffered DIMM. The number of ranks per the channel increases compared to a conventional number of ranks per the channel while not requiring an increase in the number of pins in the buffered DIMM compared to the conventional number of pins of the buffered DIMM and not requiring an increase in the number of pins in the memory controller compared to the conventional number of pins of the memory controller
530

Determine if said plurality of CS signals belong to the at least one buffered DIMM by DIMM Inter-Integrated Circuit ($I^2C$) addressing.
540

Increase the ranks per channel to a maximum number of ranks per said channel. The maximum number of ranks per said channel is [2^(number of CS per DIMM) x ((number of CS per channel) / (number of CS per DIMM))].
550

Reduce a number of on-die-termination (ODT) pins needed at the at least one buffered DIMM compared to a conventional number of ODT pins needed at the at least one said buffered DIMM based at least, in part, by DIMM Inter-Integrated Circuit ($I^2C$) addressing
560

Reduce a number of clock-enable (CKE) pins needed at the at least one buffered DIMM compared to a conventional number of CKE pins needed at the at least one buffered DIMM based at least, in part, by DIMM Inter-Integrated Circuit ($I^2C$) addressing.
570

FIG. 5

INCREASING THE NUMBER OF RANKS PER CHANNEL

FIELD

Embodiments of the present technology relates generally to the field of memory.

BACKGROUND

Industry typically desires memory performance and capacity to increase faster than what memory technology allows. For example, there is always a need for increased performance and capacity for memory such as dynamic random access memory (DRAM) and dual in-line memory module (DIMM), which has a series of DRAMs. However, memory technology often does not meet these desires due to various limitations. Moreover, even if there are solutions that increase the performance and capacity of current memory technology, the solutions that increase the memory performance and capacity can have their own limitations and/or cause additional problems, such as signal degradation, increased power, additional complexity, additional pin count and the like.

BRIEF DESCRIPTION OF THE DRAWINGS

FIG. 3 illustrates an example of a flow chart of a method for increasing the number of ranks per channel, in accordance with an embodiment of the present invention.

FIG. 4 illustrates an example of a flow chart of a method for increasing the number of ranks per channel, in accordance with an embodiment of the present invention.

FIG. 5 illustrates an example of a flow chart of a method for increasing the number of ranks per channel, in accordance with an embodiment of the present invention.

Figure 1A:
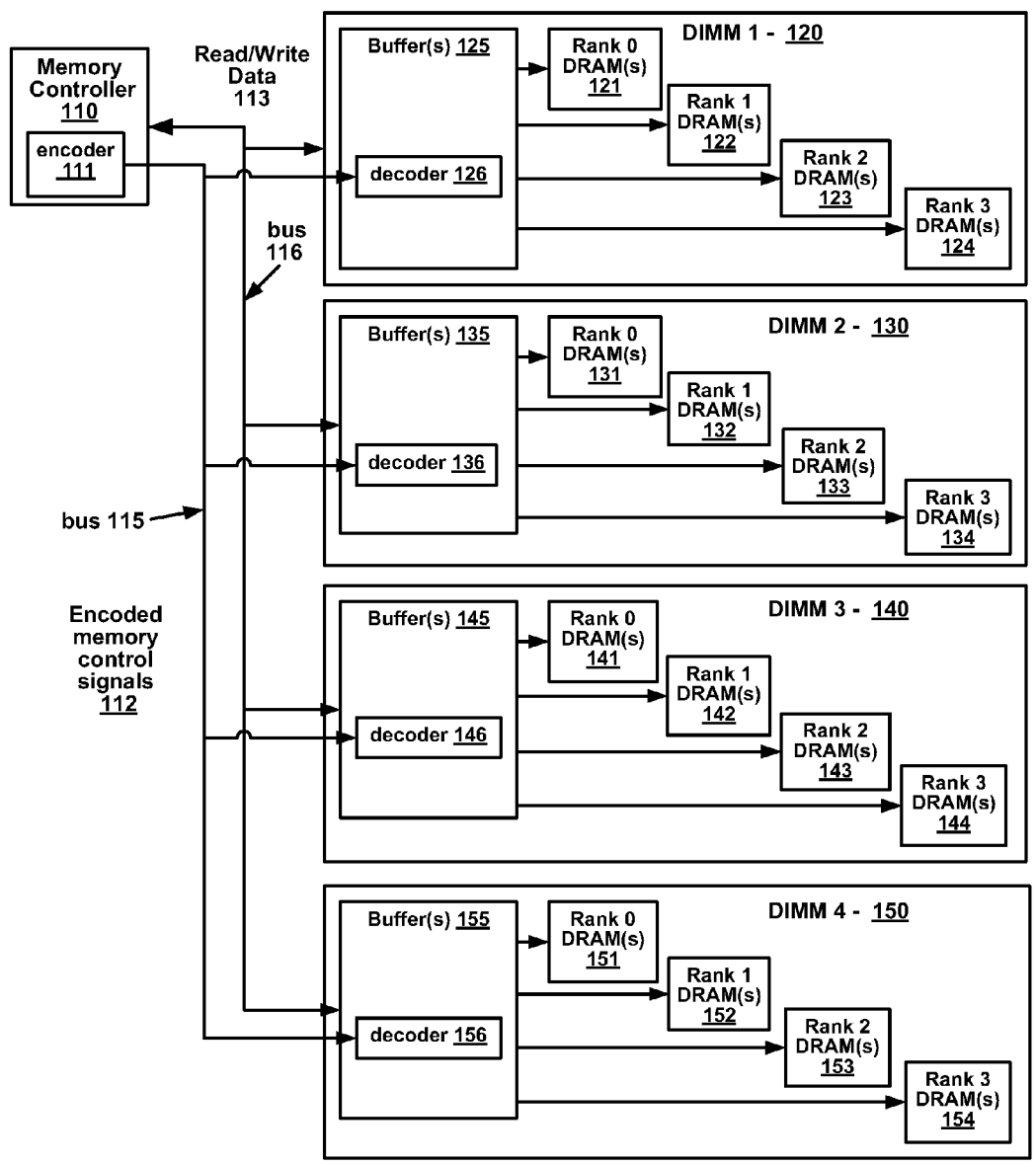
FIG. 1A illustrates an example of a system for increasing the number of ranks per channel, in accordance with an embodiment of the present invention.

The drawings referred to in this description should be understood as not being drawn to scale except if specifically noted.

DESCRIPTION OF EMBODIMENTS

Reference will now be made in detail to embodiments of the present technology, examples of which are illustrated in the accompanying drawings. While the technology will be described in conjunction with various embodiment(s), it will be understood that they are not intended to limit the present technology to these embodiments. On the contrary, the present technology is intended to cover alternatives, modifications and equivalents, which may be included within the spirit and scope of the various embodiments as defined by the appended claims.

Furthermore, in the following description of embodiments, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the present embodiments.

To improve memory functionality, memory operating speed is often traded for memory capacity or vice versa, due to, in part, limitations in memory technology. An example of limitations of memory technology can be found in double-data-rate three (DDR3) and double-data-rate four (DDR4) technology. DDR3 and DDR4 speeds (800 MT/s to 3.2 GT/s) using the conventional bidirectional multi-stub, multi-load bus are approaching, if not already reached their technological limits.

One way to increase memory speed without decreasing memory capacity is by using a buffered DIMM. A buffered DIMM can have a 1:x (where x is a multiple of 2) buffer or a multiplexer (MUX) installed on the DIMM on the data/strobe lines between a memory controller and the DRAMs located on the DIMM. The buffer or MUX allows each DIMM to look like a single DRAM load while in actuality there are a plurality of DRAM ranks (ranks are in multiples of 2). Examples of a buffered DIMM are a load decoupled DIMM (LD-DIMM) and a registered DIMM (R-DIMM).

Increasing the number of ranks in a DIMM also increases memory functionality. A rank represents all the DRAM devices on a DIMM selected when a memory controller executes a memory transaction. For example, in a single rank DIMM, each DRAM on the DIMM is accessed in a memory transaction (e.g., read or write operation). In a dual rank DIMM, one half of all the DRAM is accessed in a memory transaction. In a quad rank DIMM, a quarter of all the DRAM is accessed in a memory transaction.

The benefit of increasing a rank on a DIMM is the greater the rank, the greater the memory capacity of a DIMM. A quad rank device will have four times the amount of DRAM device on a DIMM compared to a single rank DIMM and therefore have four times the memory capacity. A quad rank DIMM can replace a lower ranked DIMM in the same DIMM slot or connector, only if the quad rank DIMM has the same number of pins as the lower ranked DIMM. Current memory technology has not advanced past a quad rank DIMM. However, there is a demand for greater than quad rank DIMMs for greater memory capacity.

Typically, increasing the number of ranks in a DIMM has limitations such as signal degradation and increasing the number of signals for a DIMM and/or memory controller. Additional pins on the DIMM are required to accommodate the additional signals for increasing the rank of the DIMM. Additional pins on a DIMM can be detrimental, especially if the DIMM is at maximum signal capacity. The additional pins in a DIMM can lead to increased costs such as but not limited costs for modifying the DIMM to accommodate the additional number of pins.

An embodiment in accordance with the present invention provides a system 100 for increasing the number of ranks per channel, as illustrated in FIG. 1A. A channel represents all the DIMMs connected to the same data lines. Likewise, a channel represents all of the DRAM that are connected on the same data lines. System 100 includes a memory controller 110 and a memory encoder 111 located within the memory controller 110. Memory controller 110 is coupled to buffered DIMMs 120-150 by bus 115. Bus 115 carries the encoded memory control signals (e.g., address/control signals) 112 from the memory controller to the buffers on the DIMMs. Bus 116 carries read/write data 113 between the DIMMs and the memory controller 110. Memory controller 110 is for managing the data to and from buffered DIMMs 120-150. In one embodiment, memory controller 110 is coupled to at least one buffered DIMM. In another embodiment, memory controller 110 can be coupled to a plurality of buffered DIMMs subject to the conventional constraints of a motherboard such as but not limited to size, heat loading and the like.

Memory controller 110 includes an encoder 111 for encoding memory control signals 112. In one embodiment, the encoder 111 is an encoding state machine (e.g., software, firmware and hardware) which receives commands from the memory controller 110 and encodes the commands according to a pre-established algorithm. The memory controller 110 includes enough intelligence to accomplish the correct signal controlling.

Buffered DIMM 120 includes four ranks of DRAM 121-124. Accordingly, buffered DIMM 120 is a quad rank buffered DIMM. Buffered DIMM 120 includes a buffer 125 that is disposed on DIMM 120. Buffer 125 includes a decoder 126 for decoding the encoded memory control signals 112 encoded at the encoder 111 on memory controller 110.

Buffered DIMMs 130-150 are similar to buffered DIMM 120. Each buffered DIMM 130-150 includes four ranks (e.g., 131-134, 141-144 and 151-154, respectively), a buffer (e.g., 135, 145 and 155, respectively) and a decoder disposed in each buffer (e.g., 136, 146 and 156, respectively). Buffered DIMMs 130-150 are quad rank DIMMs. In one embodiment, buffered DIMMs 120-150 are identical. In another embodiment, the buffered DIMMs are LD-DIMMs. LD-DIMMs use one, two or a multiple (up to 9) buffers/MUXs installed on the DIMM which receive memory data/strobes and address/control signals as inputs and then distribute the inputs to two or four ranks of a x4 or x8 DRAMs. In an additional embodiment, the buffered DIMMs are R-DIMMs. In yet another embodiment, buffered DIMMs are any combination of R-DIMMs, LD-DIMMs or any type of buffered DIMM. As stated above, it should be appreciated that system 100 includes at least one buffered DIMM and can include any number of buffered DIMMs subject to the conventional constraints of the motherboard. System 100 is compatible with and expands upon protocols for R-DIMM, buffered DIMM technology, and LD-DIMM technology, allowing backward compatibility with existing system designs.

FIG. 1A depicts buffered DIMMs 120-150 being quad rank DIMMs. However, it should be appreciated that any of the buffered DIMMs can have a conventional number of ranks such as but not limited to a single rank or a double rank.

Typically, DIMMs have a form factor with specifications determined by the Joint Electron Devices Engineering Council (JEDEC). Likewise, the DIMM form factors also have a JEDEC approved number of pins or pin-out. DIMM pin-out can vary. For example, DIMMs can have pin-out of, but not limited to 72, 100, 200, 204, 214 or 240. The DIMM connectors or sockets that the DIMMs are placed into also have specifications determined by JEDEC. Accordingly, for example, a 240 pin DIMM can only fit into a 240 pin DIMM connector. It should be appreciated that a DIMM having a pin-out determined by JEDEC or any other standards organization is a DIMM having a conventional number of pins. It should also be appreciated that DIMMs 120-150 are conventional DIMMs including conventional pin-out.

Memory controllers use a JEDEC standard defined interface to the DIMM/DRAM. A memory controller having a JEDEC standard defined interface to the DIMM/DRAM is a conventional memory controller having a conventional number of pins.

FIG. 1A depicts buffered DIMMs 120-150 on the same channel with the memory controller 110. Thus, all of the DRAM on each buffered DIMM are also on the same channel with the memory controller 110. Increasing ranks on a DIMM is possible by adding additional signals associated with selecting the DRAM on the DIMM. However, increasing the number of signals to the DIMM requires use of additional pins on the DIMM. Also, increasing the ranks on a DIMM and/or channel also degrades the signal quality. If a DIMM is at signal capacity and the functionality of all pins in the DIMM are also at capacity, then it is not possible to increase the number of ranks on a DIMM, without increasing the conventional DIMM pin-out. Modifying the conventional DIMM pin-out would require the conventional DIMM connector to also be modified to correspond to the increase in pins on the DIMM.

In order to increase the number of ranks per channel without increasing the number of address/control pins for a memory operation in system 100, memory controller 110 receives a memory access request. The memory controller 110 encodes memory control signals to buffered DIMMs 120-150 at encoder 111. The control signals include chip select (CS) signals, an on-die termination signal (ODT) and a clock-enable (CKE) signal. In one embodiment, the CS signals are four CS signals. In another embodiment, the CS signals are the maximum CS signals allowed for a memory access request per industry standards. In a further embodiment, the control signals include a single ODT signal and a single CKE signal. The memory controller 110 uses a single ODT pin to enable a buffer on the buffered DIMM on-die termination and the memory controller uses a single CKE pin to tell the buffered DIMMs to enter or exit a power down mode, which is described in detail later. In yet another embodiment, CS signals, ODT and CKE signal are encoded in combination. It should be appreciated that the encoding of the CS signals changes the traditional behavior of the CS signals from a point-to-point unidirectional control signals to a bussed, multi-stub, unidirectional signals.

The encoded memory control signals 112 are driven to each buffered DIMM 120-150. Each buffer 125-155 on each buffered DIMM 120-150 receives the encoded memory control signals 112. Accordingly, each decoder 126-156 on each buffer 125-155 decodes the encoded memory control signals 112. If the commands from the decoded memory control signals 112 belong to the buffered DIMM then the signals (i.e, CS, ODT and CKE) are sent to the appropriate rank on the buffered DIMM. If the commands from the decoded memory control signals 112 do not belong to the buffered DIMM, then the signals are discarded. This determination is accomplished by DIMM Inter-Integrated Circuit ($I^2C$) addressing, which is described detail later.

The industry standard (i.e., JEDEC) DDR3 R-DIMM design has a maximum of four CS input signals, two ODT signals and two CKE signals. Therefore, solutions to the increase the functionality of a DDR3 implementation is limited to four CS input signals, two ODT signals and two CKE signals.

Typically, each quad rank DIMM, in FIG. 1A, receives all four CS signals. In other words, it is a point-to-point CS bus or each rank has its own chip select. Encoding the four CS signals and driving the encoded signals over an encoded bus with four DIMMs allows for the increase of ranks per channel compared to the conventional eight ranks per channel. In one embodiment, sixteen ranks per DIMM can be selected by only using four CS pins, one ODT pin and one CKE pin. The selection of sixteen ranks can be done with true CS encoding. An example of encoding is shown in the following Table 1:

| CS_L[0] | CS_L[1] | CS_L[2] | CS_L[3] | State |
|---|---|---|---|---|
| x | x | x | x | NOP when RAS, CAS and WE are high. NOP driven by MC between valid commands |
| 0 | 0 | 0 | 0 | Rank 0 is selected |
| 1 | 0 | 0 | 0 | Rank 1 is selected |
| 0 | 1 | 0 | 0 | Rank 2 is selected |
| 1 | 1 | 0 | 0 | Rank 3 is selected |
| 0 | 0 | 1 | 0 | Rank 4 is selected |
| 1 | 0 | 1 | 0 | Rank 5 is selected |
| 0 | 1 | 1 | 0 | Rank 6 is selected |
| 1 | 1 | 1 | 0 | Rank 7 is selected |
| 0 | 0 | 0 | 1 | Rank 8 is selected |
| 1 | 0 | 0 | 1 | Rank 9 is selected |
| 0 | 1 | 0 | 1 | Rank 10 is selected |
| 1 | 1 | 0 | 1 | Rank 11 is selected |
| 0 | 0 | 1 | 1 | Rank 12 is selected |
| 1 | 0 | 1 | 1 | Rank 13 is selected |
| 0 | 1 | 1 | 1 | Rank 14 is selected |
| 1 | 1 | 1 | 1 | Rank 15 is selected |

The encoded CS signals are read by the buffers or registers which then generate CS signals to the appropriate DRAM rank using a defined behavior. In one embodiment, the defined behavior is DDR3. In another embodiment, the defined behavior is DDR4.

For example, with reference to FIG. 1A and Table 1, if a request to read data stored in rank 142 of DIMM 140 (i.e, "rank 1 of DIMM 3") which correlates to Rank 9 in Table 1, the memory controller 110 sends out the signal "1001" over the encoded bus 115. All the buffers in the system read and decode "1001." However, only buffer 145 of DIMM 140 sends the appropriate command to Rank 1 of DIMM 140.

It should be appreciated that there are other implementations of increasing the number of ranks per channel other than in a quad rank per channel as depicted in FIG. 1A. In various embodiments, dual rank, quad rank and eight rank DIMMs are installed on one memory channel. In another embodiment, for systems that have space limitations, a sixteen rank DIMM can be designed which fits in an industry standard DIMM connector, subject to proper cooling for such a dense DIMM.

The increase in ranks per channel without customizing a DIMM (and corresponding DIMM connector) is facilitated by assigning certain CS signals to certain DIMM buffers or registers such that the buffers will only forward the commands associated with the CS signals to the DRAM ranks sitting behind them, as described above. In one embodiment, in relation to FIG. 1A and Table 1, CS signals [0:3] are assigned to the buffer or register of DIMM 120. CS signals [7:4] are assigned to the buffer or register of DIMM 130, CS signals [11:8] are assigned to the buffer or register of DIMM 140 and CS signals [15:12] are assigned to the buffer or register of DIMM 150.

Figure 1B:
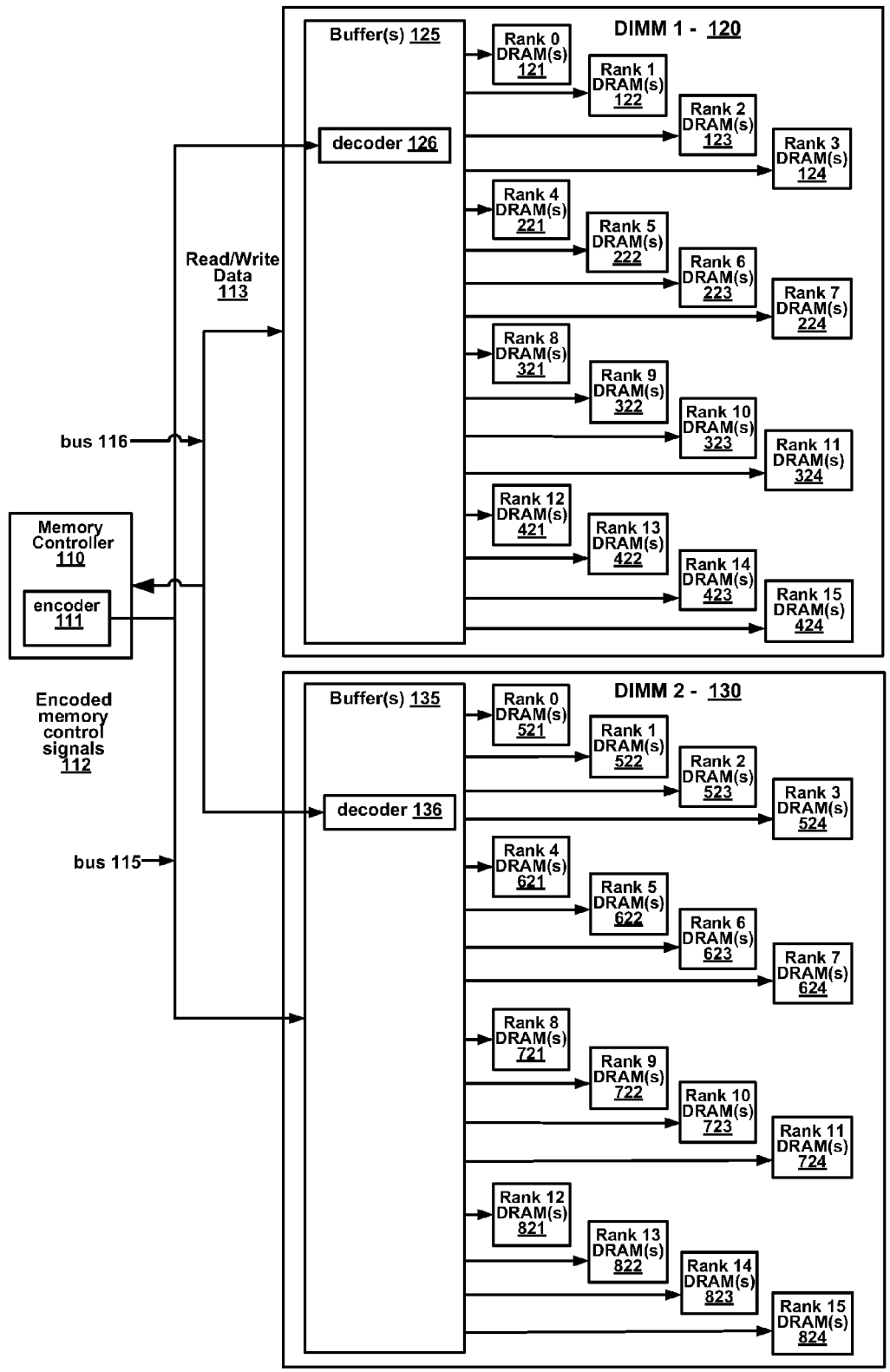
FIG. 1B illustrates an example of a system for increasing the number of ranks per channel, in accordance with an embodiment of the present invention.

FIG. 1B illustrates an embodiment of the system 100 that has the number of ranks per channel increased (as compared to FIG. 1A). FIG. 1B also illustrates an embodiment of maximum implementation. The memory controller 110 uses eight CS per channel. All eight CS signals are bussed to the two 16 rank DIMMs to get the encoding/decoding that would allow for the maximum implementation. For example, DIMM 120 receives a set of four encoded CS signals and DIMM 130 receives another set of four encoded CS signals.

It should be appreciated that an increase of the number of ranks per DIMM (e.g., 16 ranks per DIMM) is accomplished without increasing the number of CS per DIMM. Likewise, the ranks per channel are increased to 32 ranks per channel without increasing the number of CS driven by the memory controller. If the memory controller implementation changes to accommodate more CS, then the maximum number of ranks per channel is:

$$\text{Number of ranks per channel} = [2^{\wedge}(\text{number of CS per DIMM}) \times ((\text{number of CS per channel})/(\text{number of CS per DIMM}))] \quad \text{(Equation 1)}$$

To assign certain CS signal ranges to buffers at a certain DIMM location in a certain DIMM slot without having to have a special DIMM for each slot, DIMM I$^2$C addressing is used. According to the JEDEC DIMM specification, each DIMM hosts an I$^2$C bus which communicates with an Electrically Erasable Programmable Read-Only Memory (EE-PROM) and, in some cases with a temperature sensor. All the DIMMs on a channel are connected to the same I$^2$C bus and have individual I$^2$C addresses which are set by pulling up/down the three I$^2$C address pins for each DIMM connector on the system board or memory riser card.

If the I$^2$C address bits are connected to the buffer or the register, the buffer or the register will have an individual identification or address which is the same as the DIMM I$^2$C address used by the system to individually locate the DIMM. Each buffer or register, depending on its unique address, will be programmed at boot to decode only the CS signals associated with a particular DIMM location and ignore the rest of the CS signals.

Various embodiments in accordance with the present invention can incorporate Serial Presence Detect (SPD) address bits. The SPD address values are stored in a register on the buffer or register on each DIMM. At boot, to program the buffer or register with the correct CS signal range, the system firmware (e.g., basic input/output system (BIOS)) first sends control word with the unique address corresponding to the buffer or register to be programmed. Then the system firmware sends the CS signal start (lowest order CS signal to be used by a DIMM) and the CS signal finish (highest order CS signal to be used by the DIMM) which are stored in two separate registers on the buffer or register.

Depending on the number of ranks per DIMM identified on the SPD EEPROM, the system firmware will select the correct range of CS signals for each DIMM and program a register in the buffer or register. The system firmware will continue to identify the types of DIMMs installed in each DIMM socket and program the memory controller to drive only the CS signals for the ranks which are installed in the system.

In one embodiment, DIMM I$^2$C addressing is used to program which CS signals are going to be decoded by which DIMM. The DIMM I$^2$C address allows the traditional point-to-point CS to become a multi-drop unidirectional bus and accordingly, reduces the number of CS pins needed at the memory controller.

In another embodiment, the combination of the DIMM I$^2$C addressing, CS and ODT encoding allows the use of a single ODT pin per DIMM. The ODT bus transforms from a traditional point-to-point to a multi-drop unidirectional bus, hence reducing the number of ODT pins needed at the memory controller and the DIMM.

In a further embodiment, the combination of the DIMM I$^2$C addressing, CS and ODT encoding allows the use of a single CKE pin per DIMM. The CKE bus transforms from a traditional point-to-point to a multi-drop unidirectional bus, hence reducing the number of CKE pins needed at the memory controller and the DIMM.

Figure 2:
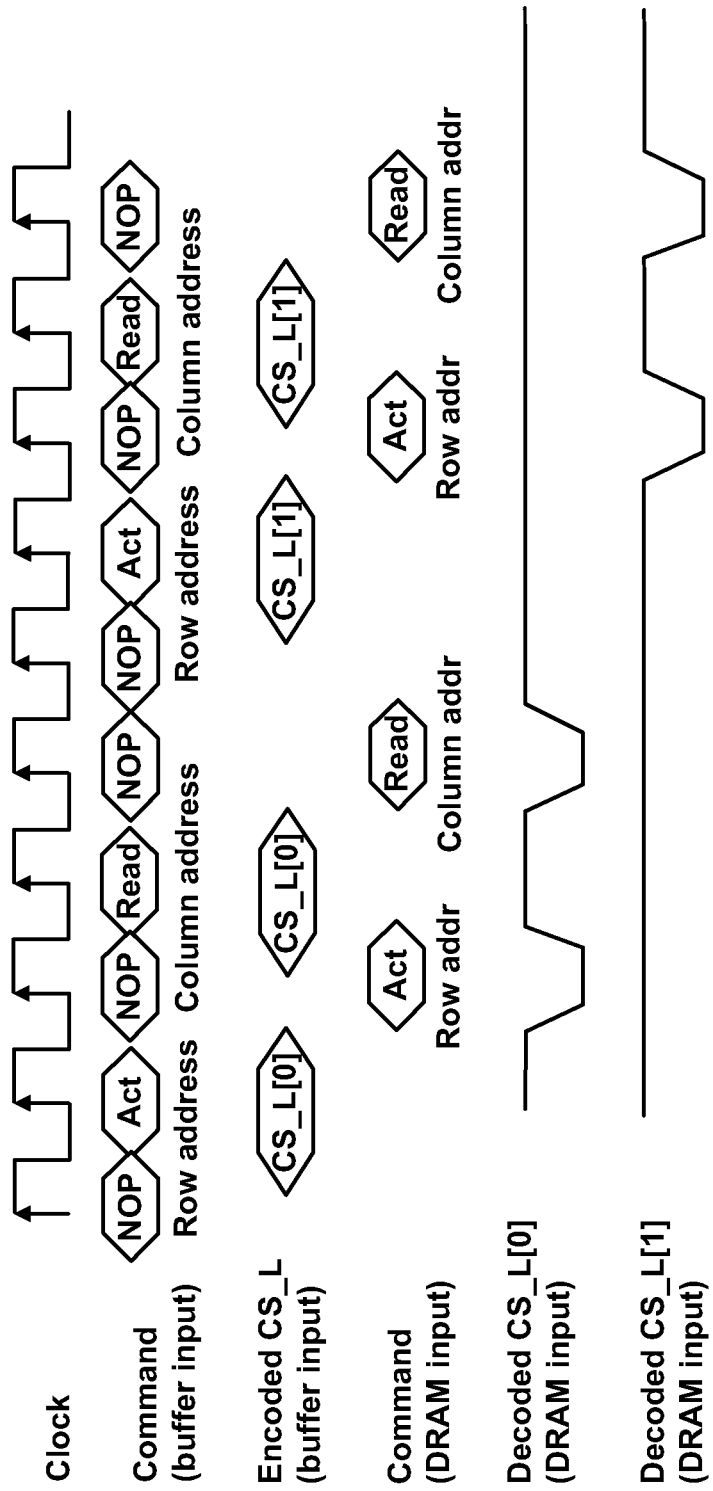
FIG. 2 illustrates an example of a timing diagram of encoded signals, in accordance with an embodiment of the present invention.

FIG. 2 illustrates a timing diagram for a reading or writing data from/to DRAM on a channel in accordance to an embodiment of the present invention. Without going into specific details into DRAM technology, the Clock, Command (buffer input) and Encoded CS_L (buffer input) lines describe the behavior of the output of the memory controller and the input to the buffers of the buffered DIMMs. The Command (buffer input) line depicts a No Operation (NOP) command, which signals a state when no command signals are driven, followed by an Activate (ACT) command. It should be appreciated that the NOP command is driven by the memory controller to the buffers when no valid commands are sent from the memory controller to the DIMMs. The NOP facilitates in the encoding of multiple states (e.g., sixteen states in Table 1). The NOP communicates to the buffer for the states when the CS is not valid. Once a valid command is sent to the buffer, then the encoded state is read again. It should also be appreciated that the NOP command occurs when the row address strobe signal (RAS), column address strobe signal (CAS), and write enable signal (WE) are not asserted.

The Command (DRAM input), Decoded CS_L[0] (DRAM input) and the Decoded CS_L[1] (DRAM input) lines of FIG. 2 describe the behavior of the output of the buffer and the input of the DRAM behind the buffer. In general, during an ACT command, a row address is sent and the row address activates multiple columns associated with that row. Out of that row, an appropriate column is selected where data is read from or written to the DRAM. It should be appreciated that the Command (DRAM input), Decoded CS_L[0] (DRAM input) and the Decoded CS_L[1] (DRAM input) lines are similar to conventional DDR defined CS signals.

In addition to increasing the number of ranks per channel as described above, an embodiment in accordance with the present invention also decreases the memory controller pin out and also reduces power consumption. From a signal integrity perspective, the buffered DIMM appears to the memory controller as a single rank DIMM. This allows the use of weaker termination between the memory controller and the buffer resulting in lower power usage.

Conventional DDR implementation requires a memory controller to generate all the rank ODT signals (two per DIMM with current DIMM definition) with the correct timing required by the DRAM. Accordingly, only a single ODT for a buffered DIMM (e.g., LD-DIMM or R-DIMM) should be generated by the memory controller for each DIMM. In turn, the buffer can use the information it has from the CS decoding to generate an ODT to the correct rank of the DRAMs. This approach requires a single ODT pin per DIMM, which reduces the number of ODT pins at the memory controller. In one embodiment, the number of ODT pins at the memory controller are reduced by half compared to the conventional number of pins of the memory controller.

For an industry standard R-DIMM, the ODT signals driven by the memory controller are received by the register and distributed to the DRAM ranks. Each rank then receives its own ODT. Also, the register on the R-DIMM can receive a single ODT input and combine it with the CS signal rank selection information to determine which ranks on the DIMM should be terminated. The appropriate ODT signals are then generated to the DRAMs.

Similarly, the conventional CKE implementation of the memory controller and the DIMM can also be simplified. The memory controller can have a single CKE pin per channel (compared to four for a conventional implementation). Also, the DIMMs have a single CKE pin. The CKE signal is routed in a daisy chain fashion to all the DIMMs in a channel. The buffer or register use the encoded CS signal information and the state of the CKE pin to determine which ranks need to enter or exit power down modes. The above implementation can be supported on a buffer (e.g., LD-buffer) or on address/control registers similar to industry standard register DIMMs. This allows mixing of high capacity buffered DIMMs (e.g., LD-DIMMs) with lower capacity R-DIMMs on the same bus if the buffers and registers are aware of the encoding. Existing non-encoding technology can be mixed with the new encoding technology if the memory controller has the correct behavior.

It should be appreciated that the CS and ODT encoding/decoding allows for better granularity of which ranks per DIMM are going to be terminated (one can terminate one single rank for example) thus creating additional DIMM power savings. Moreover, CS and CKE encoding/decoding allows for better granularity of which ranks per DIMM are going to enter power down modes resulting in system power savings and optimized performance (i.e., one does not need to place two ranks at a time in power down mode, trading off either power savings if one of the two ranks can not go in power down mode because it is being accessed or performance by delaying access to a rank which otherwise could be active if not forced in power down mode because it is sharing a CKE signal with another rank).

FIG. 3 is a flowchart illustrating a method 300 for increasing a number of ranks per channel. In one embodiment, method 300 is carried out by processors and electrical components under the control of computer readable and computer executable instructions. The computer readable and computer executable instructions reside, for example, in a data storage medium such as computer usable volatile and non-volatile memory. However, the computer readable and computer executable instructions may reside in any type of computer readable storage medium. In one embodiment, method 300 is performed at least by system 100 of FIG. 1.

It should be appreciated that the channel in method 300 comprises at least one buffered DIMM, wherein the at least one buffered DIMM includes a conventional number of ranks and a conventional number of pins. A conventional number ranks can be but is not limited to one, two or four ranks.

At step 310, a memory access request is received at a memory controller where the memory controller includes a conventional number of pins. At step 320, a plurality of CS signals are encoded at the memory controller where the plurality of CS signals are based on the memory access request. The number of ranks per channel increases compared to a conventional number of ranks per channel while not requiring an increase in the number of pins in the memory controller compared to the conventional number of pins of the memory controller.

In one embodiment, at step 325, a reduced plurality of CS signals are encoded at the memory controller. The reduced plurality of CS signals is less than a conventional plurality of CS signals. The reduced plurality of CS signals reduces the number of CS pins needed at the memory controller. In one embodiment, a reduced plurality of CS signals are encoded at the memory controller, while still being able to control the same or more ranks per memory controller.

At step 330, a single ODT signal and a single CKE signal are encoded at the memory controller and for the increase in the number of ranks per the buffered channel. In one embodiment, the CS, ODT and CKE signals are encoded in combination.

In one embodiment of method 300, a NOP command is encoded when no valid commands are sent from the memory controller to the DIMMs. In another embodiment, the plurality of CS signals changes from point-to-point unidirectional signals to bussed, multi-stub unidirectional signals.

FIG. 4 is a flowchart illustrating a method 400 for increasing a number of ranks per channel. In one embodiment, method 400 is carried out by processors and electrical components under the control of computer readable and computer executable instructions. The computer readable and computer executable instructions reside, for example, in a data storage medium such as computer usable volatile and non-volatile memory. However, the computer readable and computer executable instructions may reside in any type of computer readable storage medium. In one embodiment, method 400 is performed at least by system 100 of FIG. 1.

It should be appreciated that the channel in method 400 includes at least one buffered DIMM, wherein the at least one buffered DIMM includes a conventional number of ranks and a conventional number of pins. A conventional number ranks can be but is not limited to one, two or four ranks.

At step 410 of method 400, a plurality of encoded of CS signals are received at a buffer of at least one buffered DIMM. In one embodiment, a encoded CS signals are received at each buffer of a plurality of DIMMs. It should be appreciated that the plurality of DIMMs can be LD-DIMMs, R-DIMMs and/or any buffered DIMM.

At step 420, the plurality of CS signals are decoded at the buffer of the at least one buffered DIMM, wherein the number of ranks per channel increases compared to a conventional number of ranks per channel while not requiring an increase in the number of pins in the at least one buffered DIMM compared to the conventional number of pins of the at least one buffered DIMM. In one embodiment, a conventional number CS signals at the buffer of the buffered DIMM is encoded. In another embodiment, a plurality of encoded CS signals are decoded at every buffer of a plurality of DIMMs, such that the number of ranks per said channel increases compared to a conventional number of ranks per channel while not requiring an increase in the number of pins in the plurality of buffered DIMMs compared to a conventional number of pins of the plurality of buffered DIMMs. In an additional embodiment, a maximum number of CS signals conventionally allowed are decoded at a buffer of a DIMM.

At step 430 a single ODT and at step 440 a single CKE signal is decoded at a buffer of at least one buffered DIMM for the increase in the number of ranks per channel. In one embodiment, CS signals, a single ODT signal and a single CKE are decoded in combination. In an additional embodiment, the CS signals, a single ODT signal and a single CKE are decoded at every buffer on every DIMM on the channel.

At step 450, if the plurality of CS signals belong to the at least one buffered DIMM is determined by DIMM Inter-Integrated Circuit (I²C) addressing. At step 460, the number of ranks per channel is increased to 32 ranks per channel. In one embodiment, an increase in the rank per DIMM (e.g., 16 ranks per DIMM) is accomplished without increasing the number of CS per DIMM. In another embodiment, the ranks per channel are increased to 32 ranks per channel without increasing the number of CS driven by the memory controller. It should be appreciated that If the memory controller implementation changes to accommodate more CS, then the maximum number of ranks per channel is [2^(number of CS per DIMM)×((number of CS per channel)/(number of CS per DIMM))].

At step 470, a number of ODT pins needed at the at the buffered DIMM is reduced compared to a conventional number of ODT pins needed at the buffered DIMM based at least, in part, by DIMM I²C addressing. At step 480, reducing a number of clock-enable CKE pins needed at the buffered DIMM is reduced compared to a conventional number of CKE pins needed at the buffered DIMM based at least, in part, by I²C addressing.

FIG. 5 is a flowchart illustrating a method 500 for increasing a number of ranks per channel. In one embodiment, method 500 is carried out by processors and electrical components under the control of computer readable and computer executable instructions. The computer readable and computer executable instructions reside, for example, in a data storage medium such as computer usable volatile and non-volatile memory. However, the computer readable and computer executable instructions may reside in any type of computer readable storage medium. In one embodiment, method 500 is performed at least by system 100 of FIG. 1.

It should be appreciated that the channel in method 500 includes at least one buffered DIMM, wherein the at least one buffered DIMM includes a conventional number of ranks and a conventional number of pins. A conventional number ranks can be but is not limited to one, two or four ranks.

At step 510 of method 500, a memory access request is received at a memory controller where the memory controller comprises a conventional number of pins. At step 520, a plurality of CS signals are encoded at the memory controller where the plurality of CS signals are based on the memory access request.

At step 530, the plurality of CS signals are decoded at the buffer of the at least one buffered DIMM, wherein the number of ranks per channel increases compared to a conventional number of ranks per channel while not requiring an increase in the number of pins in the at least one buffered DIMM compared to the conventional number of pins of the at least one buffered DIMM. In one embodiment, a conventional number CS signals at the buffer of the buffered DIMM are encoded. In another embodiment, a plurality of encoded CS signals are decoded at every buffer of a plurality of DIMMs, such that the number of ranks per channel increases compared to a conventional number of ranks per channel while not requiring an increase in the number of pins in the plurality of buffered DIMMs compared to a conventional number of pins of the plurality of buffered DIMMs. In an additional embodiment, a maximum number of CS signals conventionally allowed are decoded at a buffer of a DIMM.

In various embodiments of method 500, a single ODT and a single CKE signal are decoded at a buffer of at least one buffered DIMM for the increase in the number of ranks per the buffered channel. In one embodiment, CS signals, a single ODT signal and a single CKE are decoded in combination. In an additional embodiment, the CS signals, a single ODT signal and a single CKE are decoded at every buffer on every DIMM on the channel.

At step 540, if the plurality of CS signals belong to the at least one buffered DIMM is determined by DIMM I²C addressing. At step 550, the ranks per channel is increased to a maximum number of ranks per said channel. In one embodiment, maximum number of ranks per said channel is [2^(number of CS per DIMM)×((number of CS per channel)/(number of CS per DIMM))].

At step 560, a number of ODT pins needed at the at the buffered DIMM is reduced compared to a conventional number of ODT pins needed at the buffered DIMM based at least, in part, by DIMM I²C addressing. At step 570, reducing a number of clock-enable CKE pins needed at the buffered DIMM is reduced compared to a conventional number of CKE pins needed at the buffered DIMM based at least, in part, by I²C addressing.

Various embodiments of the present invention are thus described. While the present invention has been described in particular embodiments, it should be appreciated that the present invention should not be construed as limited by such embodiments, but rather construed according to the following claims.

The invention claimed is:

1. A computer-implemented method for increasing a number of ranks per channel, wherein said channel comprises at least one buffered dual in-line memory module (DIMM), wherein said at least one buffered DIMM comprises a conventional number of ranks and a conventional number of pins, said method comprising:
receiving, by a computer system, a memory access request at a memory controller, wherein said memory controller comprises a conventional number of pins;
encoding, by said computer system, a plurality of chip-select (CS) signals at said memory controller, wherein said plurality of CS signals are based on said memory access request, such that said number of ranks per said channel increases compared to a conventional number of ranks per said channel while not requiring an increase in said number of pins in said memory controller compared to said conventional number of pins of said memory controller;
reducing, by said computer system, a number of on-die-termination (ODT) pins needed at said at least one said buffered DIMM compared to a conventional number of ODT pins needed at said at least one said buffered DIMM based on a combination of CS and ODT encoding and DIMM Inter-Integrated Circuit (I²C) address bits, wherein a buffer on said buffered DIMM is assigned a unique address based upon a DIMM I²C address assigned to the slot in which said buffered DIMM is installed, and wherein said buffer is programmed on boot-up to decode a subset of received CS signals based at least in part on said unique address; and
reducing, by said computer system, a number of clock-enable (CKE) pins needed at said at least one said buffered DIMM compared to a conventional number of CKE pins needed at said at least one said buffered DIMM based on said combination of CS and ODT encoding and DIMM Inter-Integrated Circuit (I²C) address bits.

2. The computer-implemented method of claim 1, wherein said method comprises:
encoding a single on-die-termination (ODT) signal and a single clock-enable (CKE) signal at said memory controller for said increase in said number of ranks per said channel.

3. The computer-implemented method of claim 1, wherein said encoding a plurality of CS signals comprises:
encoding a reduced plurality of CS signals at said memory controller, wherein said reduced plurality of CS signals is less than a conventional plurality of CS signals.

4. The computer-implemented method of claim 1, wherein said plurality of chip-select (CS) signals comprises bussed, multi-stub unidirectional signals.

5. A computer-implemented method for increasing a number of ranks per channel, wherein said channel comprises at least one buffered dual in-line memory module (DIMM), wherein said at least one buffered DIMM comprises a conventional number of ranks and a conventional number of pins, said method comprising:
receiving, by a computer system, a plurality of encoded chip-select (CS) signals at a buffer of said at least one buffered DIMM;
decoding, by said computer system, said plurality of CS signals at said buffer of said at least one buffered DIMM, such that said number of ranks per said channel increases compared to a conventional number of ranks per said channel while not requiring an increase in said number of pins in said at least one buffered DIMM compared to said conventional number of pins of said at least one buffered DIMM;
reducing, by said computer system, a number of on-die-termination (ODT) pins needed at said at least one said buffered DIMM compared to a conventional number of ODT pins needed at said at least one said buffered DIMM based on a combination of CS and ODT encoding and DIMM Inter-Integrated Circuit (I²C) address bits, wherein a buffer on said buffered DIMM is assigned a unique address based upon a DIMM I²C address assigned to the slot in which said buffered DIMM is installed, and wherein said buffer is programmed on boot-up to decode a subset of received CS signals based at least in part on said unique address; and
reducing, by said computer system, a number of clock-enable (CKE) pins needed at said at least one said buffered DIMM compared to a conventional number of CKE pins needed at said at least one said buffered DIMM based on said combination of CS and ODT encoding and DIMM Inter-Integrated Circuit (I²C) address bits.

6. The computer-implemented method of claim 5, wherein said method comprises:
decoding a single on-die-termination (ODT) signal at said buffer of said at least one buffered DIMM for said increase in said number of ranks per said channel.

7. The computer-implemented method of claim 5, wherein said method comprises:
decoding a single clock-enable (CKE) signal at said buffer of said at least one buffered DIMM for said increase in said number of ranks per said buffered channel.

8. The computer-implemented method of claim 5, wherein said method comprises:
receiving said plurality of encoded CS signals at every buffer of a plurality of DIMMs, wherein said at least one DIMM is said plurality of DIMMs; and
decoding said plurality of encoded CS signals at said every buffer of said plurality of DIMMs, such that said number of ranks per said channel increases compared to a conventional number of ranks per said channel while not requiring an increase in the number of pins in said plurality of buffered DIMMs compared to a conventional number of pins of said plurality of buffered DIMMs.

9. The computer-implemented method of claim 5, wherein said method comprises:
determining, if said plurality of CS signals belong to said at least one buffered DIMM based upon a unique identifier assigned to a buffer comprised within said DIMM based upon DIMM Inter-Integrated Circuit (I²C) address bits.

10. The computer-implemented method of claim 5, wherein said method comprises:
decoding a maximum number of CS signals conventionally allowed for said memory access of said at said buffer of said at least one DIMM;
decoding a single on-die-termination (ODT) signal at said buffer of said at least one said buffered DIMM; and
decoding a single clock-enable (CKE) signal at said buffer of said at least one said buffered DIMM.

11. The computer-implemented method of claim 5, wherein said method comprises:
increasing said number of ranks per channel to at least 32 ranks per channel.

12. A computer-implemented method for increasing a number of ranks per channel, wherein said channel comprises at least one buffered dual in-line memory module (DIMM), wherein said at least one buffered DIMM comprises a conventional number of ranks and a conventional number of pins, said method comprising:

receiving, by a computer system, a memory access request at a memory controller, wherein said memory controller comprises a conventional number of pins;

encoding, by said computer system, a plurality of chip-select (CS) signals at said memory controller, wherein said chip select signals are based on said memory access request;

decoding, by said computer system, said plurality of CS signals at a buffer of said at least one buffered DIMM, such that said number of ranks per said channel increases compared to a conventional number of ranks per said channel while not requiring an increase in said number of pins in said at least one buffered DIMM compared to said conventional number of pins of said at least one buffered DIMM and not requiring an increase in the number of pins in said memory controller compared to said conventional number of pins of said memory controller;

reducing, by said computer system, a number of on-die-termination (ODT) pins needed at said at least one said buffered DIMM compared to a conventional number of ODT pins needed at said at least one said buffered DIMM based on a combination of CS and ODT encoding and DIMM Inter-Integrated Circuit (I$^2$C) address bits, wherein a buffer on said buffered DIMM is assigned a unique address based upon a DIMM I$^2$C address assigned to the slot in which said buffered DIMM is installed, and wherein said buffer is programmed on boot-up to decode a subset of received CS signals based at least in part on said unique address; and reducing, by said computer system, a number of ODT pins needed at said memory controller compared to a conventional number of ODT pins needed at said memory controller DIMM based on the combination of said CS and ODT encoding and said DIMM I$^2$C address bits.

13. The computer-implemented method of claim 12, wherein said method comprises:

encoding a single on-die-termination (ODT) signal at said memory controller and decoding said single ODT signal at said buffer of said at least one buffered DIMM, wherein said single ODT is based on said memory access request; and encoding a single clock-enable (CKE) signal at said memory controller and decoding said signal CKE at said buffer of said at least one buffered DIMM, wherein said single CKE is based on said memory access request.

14. The computer-implemented method of claim 12, wherein said method comprises:

determining, if said plurality of CS signals belong to said at least one buffered DIMM based upon a unique identifier assigned to a buffer comprised within said DIMM based upon DIMM Inter-Integrated Circuit (I$^2$C) address bits.

15. The computer-implemented method of claim 12, wherein said method comprises:

receiving said plurality of encoded CS signals at every buffer of a plurality of DIMMs, wherein said at least one DIMM is said plurality of DIMMs; and decoding said plurality of encoded CS signals at said every buffer of said plurality of DIMMs, such that said number of ranks per said channel increases compared to a conventional number of ranks per said channel while not requiring an increase in said number of pins in said plurality of buffered DIMMs compared to a conventional number of pins of said plurality of buffered DIMMs.

16. The computer-implemented method of claim 12, wherein said increasing said ranks per channel comprises:

increasing said ranks per channel to a maximum number of ranks per said channel, wherein said maximum number of ranks per said channel is [2^(number of CS per DIMM)×((number of CS per channel)/(number of CS per DIMM))].

17. The computer-implemented method of claim 12, wherein said encoding said plurality of CS signals comprises:

encoding a reduced plurality of CS signals at said memory controller, wherein said reduced plurality of CS signals is less than a conventional plurality of CS signals.

* * * * *

UNITED STATES PATENT AND TRADEMARK OFFICE
CERTIFICATE OF CORRECTION

PATENT NO. : 8,539,145 B1  Page 1 of 1
APPLICATION NO. : 12/510822
DATED : September 17, 2013
INVENTOR(S) : Lidia Warnes et al.

It is certified that error appears in the above-identified patent and that said Letters Patent is hereby corrected as shown below:

In the Claims

In column 14, line 19, in Claim 15, delete "DI MM" and insert -- DIMM --, therefor.

Signed and Sealed this
Tenth Day of December, 2013

Margaret A. Focarino
*Commissioner for Patents of the United States Patent and Trademark Office*